(12) United States Patent
Horita

(10) Patent No.: US 9,973,166 B2
(45) Date of Patent: May 15, 2018

(54) PHASE SHIFT CIRCUIT

(71) Applicant: MURATA MANUFACTURING CO., LTD., Kyoto (JP)

(72) Inventor: Atsushi Horita, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 10 days.

(21) Appl. No.: 15/369,283

(22) Filed: Dec. 5, 2016

(65) Prior Publication Data

US 2017/0085242 A1    Mar. 23, 2017

Related U.S. Application Data

(63) Continuation of application No. PCT/JP2015/065180, filed on May 27, 2015.

(30) Foreign Application Priority Data

Jun. 6, 2014  (JP) .................................. 2014-117185

(51) Int. Cl.
*H01P 5/12*        (2006.01)
*H01P 1/18*        (2006.01)
(Continued)

(52) U.S. Cl.
CPC ................. *H03H 7/20* (2013.01); *H01P 1/18* (2013.01); *H01P 1/184* (2013.01); *H03H 7/0115* (2013.01); *H03H 7/42* (2013.01)

(58) Field of Classification Search
CPC ... H01P 5/12; H01P 1/18; H01P 1/184; H03H 7/41; H03H 7/18
(Continued)

(56) References Cited

U.S. PATENT DOCUMENTS 6,052,039 A * 4/2000 Chiou .................. H03H 7/0115
                                                      333/100
7,355,492 B2 * 4/2008 Hyman ..................... H01P 1/18
                                                      333/139
(Continued)

FOREIGN PATENT DOCUMENTS

JP      S62-176301 A    8/1987
JP      S64-18530 A     1/1989
(Continued)

OTHER PUBLICATIONS

International Search Report issued in Patent Application No. PCT/JP2015/065180 dated Jul. 14, 2015.
(Continued)

*Primary Examiner* — Dean Takaoka
(74) *Attorney, Agent, or Firm* — Pearne & Gordon LLP

(57) ABSTRACT

A phase shift circuit includes a 90° hybrid circuit, variable capacitors, a switch circuit, and a balun circuit. The 90° hybrid circuit includes a high-frequency signal input terminal and a high-frequency signal output terminal. The variable capacitors are respectively connected to between first and second variable capacitor connection terminals of the 90° hybrid circuit and the ground. The balun circuit includes an unbalanced signal input terminal and balanced signal output terminals formed by a pair of terminals. The switch circuit selects any one of the balanced signal output terminal and the balanced signal output terminal of the balun circuit and connects the selected terminal to the high-frequency signal input terminal to the 90° hybrid circuit.

11 Claims, 4 Drawing Sheets

(51) Int. Cl.
    *H03H 7/42*     (2006.01)
    *H03H 7/18*     (2006.01)
    *H03H 7/20*     (2006.01)
    *H03H 7/01*     (2006.01)

(58) Field of Classification Search
    USPC .......................................................... 333/117
    See application file for complete search history.

(56) References Cited

U.S. PATENT DOCUMENTS

| | | | |
|---|---|---|---|
| 7,978,021 B2* | 7/2011 | Tamaru | H03H 7/42 |
| | | | 333/246 |
| 9,231,549 B2* | 1/2016 | Tsai | H03H 7/20 |
| 2005/0052259 A1 | 3/2005 | Okazaki et al. | |
| 2005/0270122 A1 | 12/2005 | Hyman et al. | |

FOREIGN PATENT DOCUMENTS

| | | |
|---|---|---|
| JP | 2002-076810 A | 3/2002 |
| JP | 2004-022041 A | 1/2004 |
| JP | 2005-086533 A | 3/2005 |
| JP | 2007-532060 A | 11/2007 |

OTHER PUBLICATIONS

Written Opinon issued in Patent Application No. PCT/JP2015/065180 dated Jul. 14, 2015.

\* cited by examiner

PHASE SHIFT CIRCUIT

This is a continuation of International Application No. PCT/JP2015/065180 filed on May 27, 2015 which claims priority from Japanese Patent Application No. 2014-117185 filed on Jun. 6, 2014. The contents of these applications are incorporated herein by reference in their entireties.

BACKGROUND

Technical Field

The present disclosure relates to a phase shift circuit that adjusts a phase of a high-frequency signal.

Various types of existing phase shift circuits have been developed. For example, Patent Document 1 discloses the configuration of a phase shift circuit including a 90° hybrid circuit, variable capacitors, and inductors.

As disclosed in Patent Document 1, a 90° hybrid circuit has a ring-shaped schematic configuration in which four transmission lines are connected in order. The four transmission lines have a length of approximately a quarter of a wave length of a high-frequency signal to be transmitted. Points at which the four transmission lines are connected are assumed to be first, second, third, and fourth connection points in order. When the first connection point is set to a high-frequency signal input terminal and the fourth connection point is set to a high-frequency signal output terminal, the second connection point and the third connection point are respectively connected to the ground with parallel circuits interposed therebetween, each parallel circuit being formed by the variable capacitor and the inductor.

The phase shift circuit in Patent Document 1 adjusts a phase shift amount by adjusting capacitances of the variable capacitors. In this case, the inductors are connected to the variable capacitors in parallel to enlarge an adjustable phase range relative to the variation amounts of the capacitances of the variable capacitors.

Patent Document 1: Japanese Unexamined Patent Application Publication No. 62-176301

BRIEF SUMMARY

However, the adjustable phase range of the phase shift circuit as disclosed in Patent Document 1 as described above is approximately 180° and a desired phase cannot be obtained over approximately 360°.

Accordingly, the present disclosure provides a phase shift circuit that enables a desired phase to be obtained over approximately 360° with a simple configuration.

A phase shift circuit according to an aspect of the disclosure includes a 90° hybrid circuit, variable capacitors, a balun circuit, and a switch circuit. The 90° hybrid circuit includes a high-frequency signal input terminal and a high-frequency signal output terminal. The variable capacitors are respectively connected to between terminals of the 90° hybrid circuit other than the high-frequency signal input terminal and the high-frequency signal output terminal and the ground. The balun circuit includes an unbalanced signal input terminal and a pair of balanced signal output terminals. The switch circuit selects any one of one balanced signal output terminal and the other balanced signal output terminal of the balun circuit and connects the selected terminal to the high-frequency signal input terminal of the 90° hybrid circuit.

With this configuration, the phase shift circuit can achieve phase shift in a phase range of approximately 180° by adjusting capacitances of the variable capacitors in a first mode in which the one balanced signal output terminal of the balun circuit is connected to the high-frequency signal input terminal of the 90° hybrid circuit. Furthermore, the phase shift circuit can achieve phase shift in the phase range of approximately 180° by adjusting the capacitances of the variable capacitors in a second mode in which the other balanced signal output terminal of the balun circuit is connected to the high-frequency signal input terminal of the 90° hybrid circuit. The phase difference between a high-frequency signal that is output from the one balanced signal output terminal of the balun circuit and a high-frequency signal that is output from the other balanced signal output terminal of the balun circuit is 180°. Accordingly, the phase over approximately 360° can be obtained by combining the first mode and the second mode.

The phase shift circuit according to the aspect of the disclosure may include a resistor unit connecting the balanced signal output terminal which is not connected to the high-frequency signal input terminal to the ground.

With this configuration, the terminal of the balanced signal output terminals, which is not connected to the 90° hybrid circuit, is subjected to termination processing. Accordingly, a desired phase can be obtained with higher accuracy.

Furthermore, in the phase shift circuit according to the aspect of the disclosure, the balun circuit may be configured to include a low pass filter that is connected to between the unbalanced signal input terminal and the one balanced signal output terminal and a high pass filter that is connected to between the unbalanced signal input terminal and the other balanced signal output terminal.

Moreover, in the phase shift circuit according to the aspect of the disclosure, the low pass filter and the high pass filter may be configured by lumped constant circuit elements.

With this configuration, the balun circuit can be reduced in size, thereby forming the phase shift circuit reduced in size. In particular, the phase shift circuit can be reduced in size more effectively for a communication band having a low frequency band.

According to the present disclosure, a desired phase can be obtained over approximately 360°.

DETAILED DESCRIPTION

Figure 1:
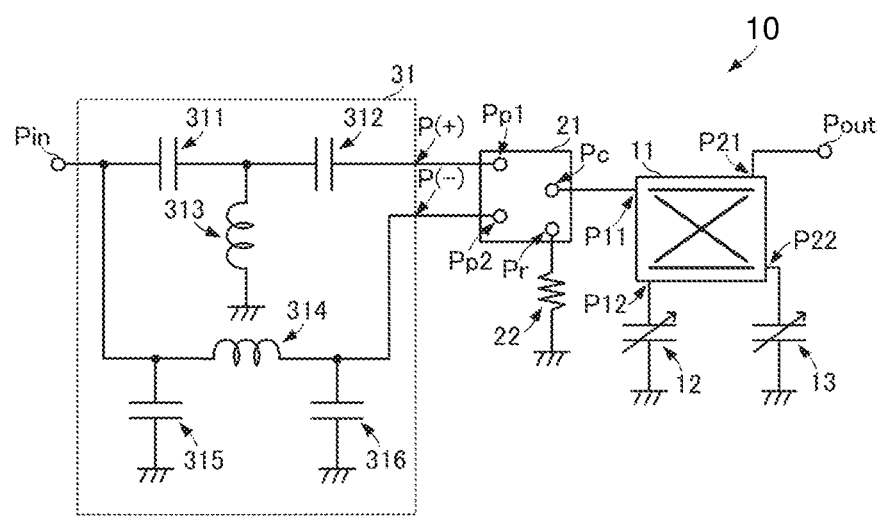
FIG. 1 is a circuit diagram of a phase shift circuit according to a first embodiment of the present disclosure.

A phase shift circuit according to a first embodiment of the present disclosure will be described with reference to the drawings. FIG. 1 is a circuit diagram of the phase shift circuit in the first embodiment of the present disclosure.

A phase shift circuit 10 includes a 90° hybrid circuit 11, variable capacitors 12 and 13, a switch circuit 21, a resistor unit 22, and a balun circuit 31.

An input terminal Pin of the phase shift circuit 10 is an unbalanced signal input terminal of the balun circuit 31. An output terminal Pout of the phase shift circuit 10 is a high-frequency signal output terminal P21 of the 90° hybrid circuit 11.

Figure 2:
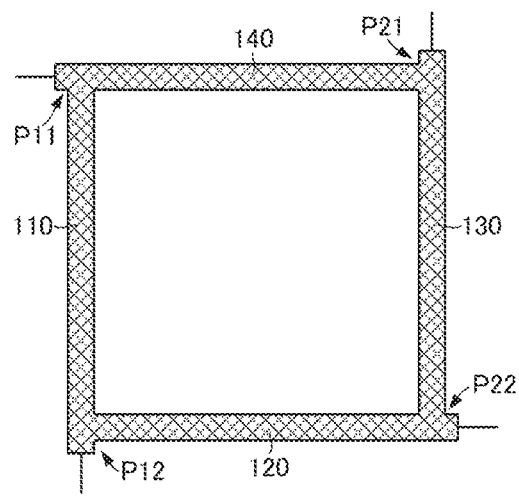
FIG. 2 is a schematic configuration diagram of a 90° hybrid circuit in the first embodiment of the present disclosure.

FIG. 2 is a schematic configuration diagram of the 90° hybrid circuit 11 in the first embodiment of the present disclosure. The 90° hybrid circuit 11 includes four transmission lines 110, 120, 130, and 140. The transmission lines 110, 120, 130, and 140 have a line length of approximately a quarter of a wave length of a high-frequency signal the phase of which is made to shift by the phase shift circuit 10, that is, the high-frequency signal that the phase shift circuit 10 transmits.

The transmission lines 110, 120, 130, and 140 are connected in a ring form in order. To be specific, one end of the transmission line 110 is connected to the other end of the transmission line 140. A connection point of them is a high-frequency signal input terminal P11 of the 90° hybrid circuit 11. The other end of the transmission line 110 is connected to one end of the transmission line 120. A connection point of them is a first variable capacitor connection terminal P12 of the 90° hybrid circuit 11. The other end of the transmission line 120 is connected to one end of the transmission line 130. A connection point of them is a second variable capacitor connection terminal P22 of the 90° hybrid circuit 11. The other end of the transmission line 130 is connected to one end of the transmission line 140. A connection point of them is a high-frequency signal output terminal P21 of the 90° hybrid circuit 11.

The first variable capacitor connection terminal P12 is connected to the ground with the variable capacitor 12 interposed therebetween. The second variable capacitor connection terminal P22 is connected to the ground with the variable capacitor 13 interposed therebetween.

A high-frequency signal input from the high-frequency signal input terminal P11 is subjected to phase shift in accordance with capacitances of the variable capacitors 12 and 13 and is output from the high-frequency signal output terminal P21. The amount of the phase shift of the high-frequency signal can be adjusted in a phase range of 180° by adjusting the capacitances of the variable capacitors 12 and 13.

The switch circuit 21 includes a common terminal Pc, selection target terminals Pp1 and Pp2, and a resistance connection terminal Pr. The selection target terminals Pp1 and Pp2 are selectively connected to the common terminal Pc. The resistance connection terminal Pr is connected to the selection target terminal that is not connected to the common terminal Pc. The resistance connection terminal Pr is connected to the ground with the termination resistor 22 interposed therebetween.

Figure 3A:
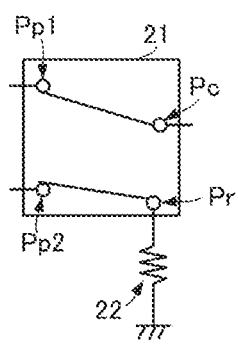
FIGS. 3A and 3B indicate connection configuration diagrams of a switch circuit in respective modes in the first embodiment of the present disclosure.
Figure 3B:
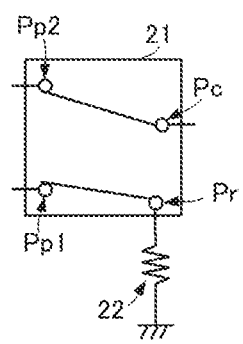

FIGS. 3A and 3B indicate connection configuration diagrams of the switch circuit in respective modes in the first embodiment of the present disclosure. FIG. 3A indicates a first mode in which the selection target terminal Pp1 and the common terminal Pc are connected to each other and FIG. 3B indicates a second mode in which the selection target terminal Pp2 and the common terminal Pc are connected to each other.

As illustrated in FIG. 3A, when the selection target terminal Pp1 and the common terminal Pc are connected to each other, the selection target terminal Pp2 is connected to the resistance connection terminal Pr. As illustrated in FIG. 3B, when the selection target terminal Pp2 and the common terminal Pc are connected to each other, the selection target terminal Pp1 is connected to the resistance connection terminal Pr.

The balun circuit 31 includes the unbalanced signal input terminal corresponding to the input terminal Pin of the phase shift circuit 10 and a pair of balanced signal output terminals formed by a first balanced signal output terminal P(+) and a second balanced signal output terminal P(−).

The first balanced signal output terminal P(+) is connected to the selection target terminal Pp1 of the switch circuit 21. The second balanced signal output terminal P(−) is connected to the selection target terminal Pp2 of the switch circuit 21.

Capacitors 311 and 312 are connected in series between the unbalanced signal input terminal and the first balanced signal output terminal P(+). A connection point of the capacitor 311 and the capacitor 312 is connected to the ground with an inductor 313 interposed therebetween. That is to say, the unbalanced signal input terminal and the first balanced signal output terminal P(+) are connected to each other with a high pass filter-type phase shift circuit interposed therebetween. With this configuration, the high-frequency signal input from the unbalanced signal input terminal is output from the first balanced signal output terminal P(+) in a state in which the phase thereof has advanced by 90°.

An inductor 314 is connected to between the unbalanced signal input terminal and the second balanced signal output terminal P(−). Both ends of the inductor 314 are connected to the ground with capacitors 315 and 316 interposed therebetween, respectively. That is to say, the unbalanced signal input terminal and the second balanced signal output terminal P(−) are connected to each other with a low pass filter-type phase shift circuit interposed therebetween. With this configuration, the high-frequency signal input from the unbalanced signal input terminal is output from the second balanced signal output terminal P(−) in a state in which the phase thereof has delayed by 90°.

Thus, in the balun circuit 31, the phase difference between the phase of a first balanced signal that is output from the first balanced signal output terminal P(+) and the phase of a second balanced signal that is output from the second balanced signal output terminal P(−) is 180°. With this, the two types of high-frequency signals between which the phase difference is 180° are input to the switch circuit 21.

Figure 4A:
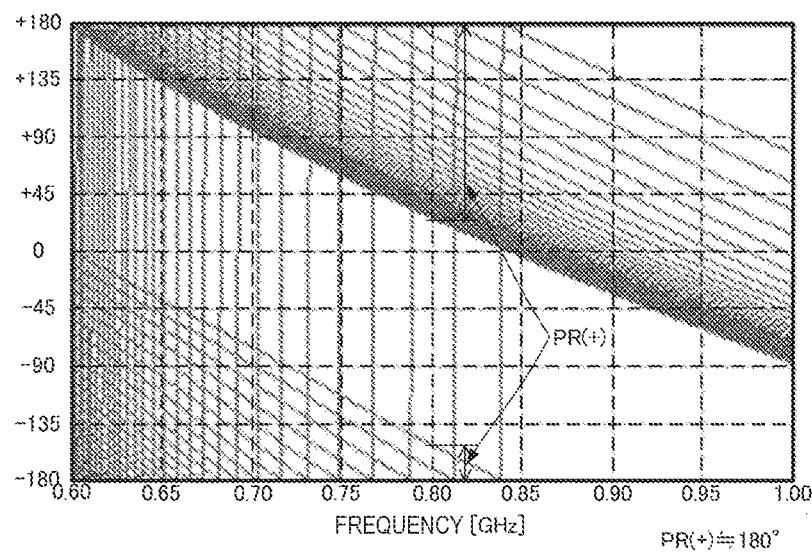
FIGS. 4A and 4B indicate phase characteristic diagrams of the phase shift circuit in the first embodiment of the present disclosure.
Figure 4B:
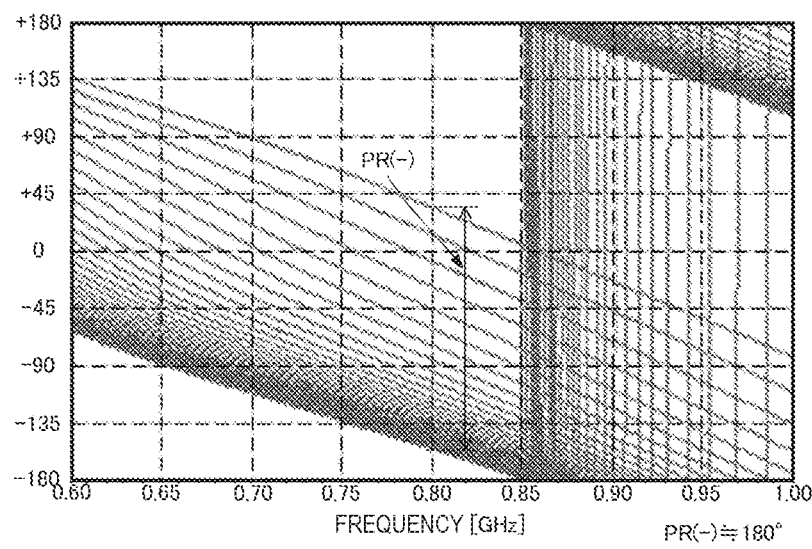

FIGS. 4A and 4B indicate phase characteristic diagrams of the phase shift circuit in the first embodiment of the present disclosure. FIG. 4A indicates the case in which the 90° hybrid circuit 11 shifts the phase of the first balanced signal (first mode) and FIG. 4B indicates the case in which the 90° hybrid circuit 11 shifts the phase of the second balanced signal (second mode).

In the first mode in which the selection target terminal Pp1 and the common terminal Pc are connected to each other, the 90° hybrid circuit 11 shifts, in a range (PR(+)=180°) of 180°, the phase of the first balanced signal, which has advanced by 90° from that of the high-frequency signal input from the input terminal Pin of the phase shift circuit 10.

On the other hand, in the second mode in which the selection target terminal Pp2 and the common terminal Pc are connected to each other, the 90° hybrid circuit 11 shifts, in a range (PR(−)=180°) of 180°, the phase of the second balanced signal, which has delayed by 90° from that of the high-frequency signal input from the input terminal Pin of the phase shift circuit 10.

The phase difference between the first balanced signal and the second balanced signal is 180° as described above. Accordingly, the phase difference between a phase center value of the phase range PR(+) that the first balanced signal can take and a phase center value of the phase range PR(−) that the second balanced signal can take is 180°. The phase range PR(+) that the first balanced signal can take and the phase range PR(−) that the second balanced signal can take are not therefore overlapped with each other as illustrated in FIG. 4A and FIG. 4B. Accordingly, the phase shift circuit 10 shifts the phase of the high-frequency signal input from the input terminal Pin in the range of 360° and the obtained high-frequency signal is output from the output terminal Pout.

As described above, employment of the configuration in the embodiment can provide the phase shift circuit 10 capable of shifting the phase of the high-frequency signal in the range of 360° with a simple circuit configuration formed by the balun circuit 31, the switch circuit 21, and the 90° hybrid circuit 11.

Furthermore, in the configuration in the embodiment, the selection target terminal that is not connected to the common terminal Pc is connected to the termination resistor 22, thereby suppressing influence by the circuit in the balun circuit 31 at the side that is not connected to the 90° hybrid circuit 11. Therefore, the phase shift circuit 10 can provide the desired phase amount with higher accuracy.

In addition, in the configuration in the embodiment, the balun circuit 31 is configured by the combination of the low pass filter and the high pass filter. Therefore, the balun circuit 31 can be configured by the combination of the lumped constant circuit elements. Accordingly, the balun circuit 31 can be reduced in size easily in comparison with a distributed constant-type balun. In particular, when the frequency of the high-frequency signal is low, the balun circuit 31 can be reduced in size more effectively in comparison with the distributed constant-type balun. This enables the phase shift circuit 10 to be reduced in size. It should be noted that the balun circuit 31 may be configured by a multilayer body in which inductors and capacitors are formed.

Figure 5:
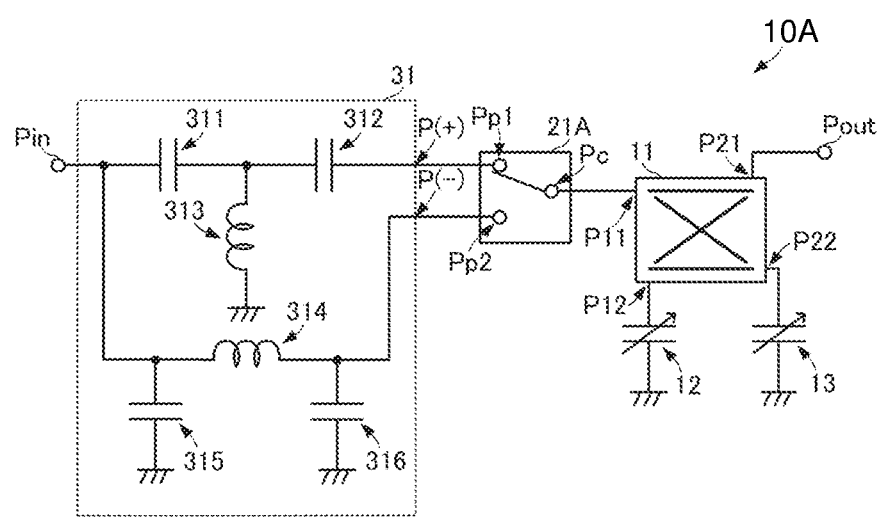
FIG. 5 is a circuit diagram of a phase shift circuit according to a second embodiment of the present disclosure.

Next, a phase shift circuit according to a second embodiment of the present disclosure will be described with reference to the drawing. FIG. 5 is a circuit diagram of the phase shift circuit in the second embodiment of the present disclosure.

As illustrated in FIG. 5, a phase shift circuit 10A in the embodiment is configured by removing the termination resistor 22 from the phase shift circuit 10 in the first embodiment. With the removal, a switch circuit 21A of the phase shift circuit 10A includes only the common terminal Pc and the selection target terminals Pp1 and Pp2 and does not include the resistance connection terminal Pr.

Even with this configuration, the phase of the high-frequency signal can be made to shift in the range of 360° as in the first embodiment. Furthermore, employment of the configuration in the embodiment can provide the phase shift circuit 10A with a simpler configuration.

Figure 6:
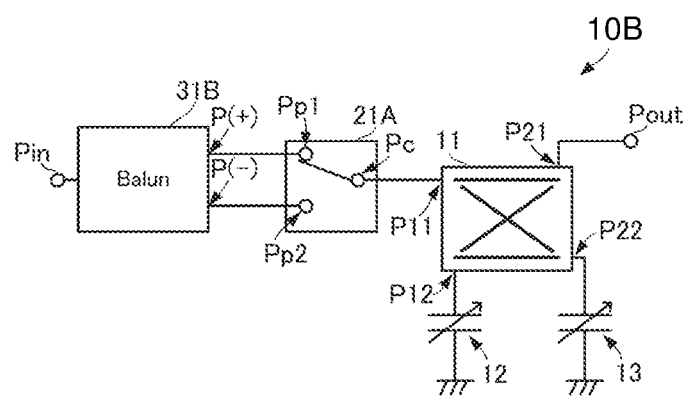
FIG. 6 is a circuit diagram of a phase shift circuit according to a third embodiment of the present disclosure.

Next, a phase shift circuit according to a third embodiment of the present disclosure will be described with reference to the drawing. FIG. 6 is a circuit diagram of the phase shift circuit in the third embodiment of the present disclosure.

As illustrated in FIG. 6, a phase shift circuit 10B in the embodiment is different from the phase shift circuit 10A in the second embodiment in the configuration of a balun circuit 31B. The balun circuit 31B is, for example, a distributed constant-type balun circuit or a balun circuit using electromagnetic field coupling of an inductor.

Even with this configuration, the phase of the high-frequency signal can be made to shift in the range of 360° as in the first and second embodiments.

Although the phase shift circuit 10B in the embodiment has the configuration in which the balun circuit 31 in the phase shift circuit 10A in the second embodiment is replaced by the balun circuit 31B, it can also employ the configuration in which the balun circuit 31 in the phase shift circuit 10 in the first embodiment is replaced by the balun circuit 31B.

REFERENCE SIGNS LIST 10, 10A, 10B PHASE SHIFT CIRCUIT
11 90° HYBRID CIRCUIT
12, 13 VARIABLE CAPACITOR
21, 21A SWITCH CIRCUIT
22 TERMINATION RESISTOR
31, 31B BALUN CIRCUIT
311, 312, 315, 316 CAPACITOR
313, 314 INDUCTOR

The invention claimed is:

1. A phase shift circuit comprising:
   a 90° hybrid circuit having four terminals, a first terminal of the 90° hybrid circuit being a high-frequency signal input terminal and a second terminal of the 90° hybrid circuit being a high-frequency signal output terminal;
   variable capacitors respectively connected between a third terminal of the 90° hybrid circuit and ground, and between a fourth terminal of the 90° hybrid circuit and ground;
   a balun circuit including an unbalanced signal input terminal and two balanced signal output terminals; and
   a switch circuit that connects a first balanced signal output terminal to the high-frequency signal input terminal of the 90° hybrid circuit.

2. The phase shift circuit according to claim 1, further comprising a resistor connected between the switch circuit and ground, wherein the switch circuit connects the balanced signal output terminal which is not connected to the high-frequency signal input terminal to the resistor.

3. The phase shift circuit according to claim 1,
   wherein the balun circuit includes:
   a low pass filter connected between the unbalanced signal input terminal and one of the balanced signal output terminals; and
   a high pass filter connected between the unbalanced signal input terminal and the other balanced signal output terminal.

4. The phase shift circuit according to claim 2,
   wherein the balun circuit includes:
   a low pass filter connected between the unbalanced signal input terminal and one of the balanced signal output terminals; and
   a high pass filter connected between the unbalanced signal input terminal and the other balanced signal output terminal.

5. The phase shift circuit according to claim 3,
   wherein the low pass filter and the high pass filter are comprised of lumped constant circuit elements.

6. The phase shift circuit according to claim 4,
wherein the low pass filter and the high pass filter are comprised of lumped constant circuit elements.

7. The phase shift circuit according to claim 1,
wherein the 90° hybrid circuit comprises four transmission lines formed as a ring.

8. The phase shift circuit according to claim 7,
wherein each of the four terminals the 90° hybrid circuit is formed at a connection between two of the transmission lines.

9. The phase shift circuit according to claim 7,
wherein each transmission line has a length of ¼ of the wavelength of a high-frequency signal input to the a high-frequency signal input terminal.

10. The phase shift circuit according to claim 1,
wherein the balun circuit is a distributed constant-type balun circuit.

11. The phase shift circuit according to claim 1,
wherein the balun circuit uses electromagnetic field coupling of an inductor.

\* \* \* \* \*